(12) United States Patent
Lam et al.

(10) Patent No.: US 6,511,901 B1
(45) Date of Patent: Jan. 28, 2003

(54) METAL REDISTRIBUTION LAYER HAVING SOLDERABLE PADS AND WIRE BONDABLE PADS

(75) Inventors: Ken M. Lam, Colorado Springs, CO (US); Julius A. Kovats, Manitou Springs, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/434,711

(22) Filed: Nov. 5, 1999

(51) Int. Cl.⁷ .............................................. H01L 21/44
(52) U.S. Cl. ....................................... 438/612; 438/106
(58) Field of Search .................... 438/612, 613, 438/187, 188

(56) References Cited

U.S. PATENT DOCUMENTS

| | | | |
|---|---|---|---|
| 4,463,059 A | * 7/1984 | Bhattacharya et al. | 428/620 |
| 5,455,387 A | 10/1995 | Hoffman et al. | 174/52.4 |
| 5,476,815 A | * 12/1995 | Kawasumi | 438/613 |
| 5,554,940 A | 9/1996 | Hubacher | 324/765 |
| 5,719,449 A | 2/1998 | Strauss | 257/786 |
| 5,774,340 A | 6/1998 | Chang et al. | 361/771 |
| 5,844,168 A | * 12/1998 | Schueller et al. | 174/52.4 |
| 5,977,624 A | * 11/1999 | Heo et al. | 257/701 |
| 6,181,569 B1 | * 1/2001 | Chakravorty | 361/761 |
| 6,232,147 B1 | * 5/2001 | Matsuki et al. | 438/108 |

FOREIGN PATENT DOCUMENTS

JP          1140940 A    *  2/1998

\* cited by examiner

*Primary Examiner*—John F. Niebling
*Assistant Examiner*—Christopher Lattin
(74) *Attorney, Agent, or Firm*—Thomas Schneck

(57) ABSTRACT

A redistribution metallization scheme combines solder bumps and wire bond pads in addition to existing bond pads to enhance the connectivity of a semiconductor device, especially in flip-chip applications. The fabrication method includes forming the additional bond pads during the redistribution deposition step. The metals used in the redistribution layer provide a solderable surface for solder bumping and a bondable surface for wire bonding.

11 Claims, 5 Drawing Sheets

METAL REDISTRIBUTION LAYER HAVING SOLDERABLE PADS AND WIRE BONDABLE PADS

TECHNICAL FIELD

The present invention relates generally to semiconductor devices and more specifically to metal redistribution layers.

BACKGROUND ART

Modern IC applications typically have high I/O pinout requirements. However, high pinouts pose problems for traditional wire bonded or TAB IC packages. Wire bonding and TAB packaging require that the die bond pads be disposed about the periphery of the semiconductor die. While I/O counts have been on the rise to accommodate increased functionality, die sizes have remained somewhat unchanged because improvements in the processing technology continue to decrease device geometries. Consequently, there is a minimum bond pitch limit with wire bonding techniques.

The development of solder bump arrays has significantly increased the pinout capability of semiconductor dice by utilizing the surface area of the die itself to provide a field of bond sites. A key element of this pinout scheme is the use of a metal redistribution layer. This is an interconnect layer disposed atop a finished semiconductor die. Electrical connections from the interconnect layer are made to the underlying die bond pads which are typically disposed about the die periphery. The interconnects serve to redistribute the bond pads from the periphery over the surface area of the die, thus permitting higher I/O pinouts out of the die.

As pinout requirements continue to increase, there is a need to combine solder bumping methods with wire binding techniques to provide even greater pinout capability. However, the materials used for each approach are mutually exclusive. Materials suited for solder bumps have poor mechanical adhesion properties and are thus not suited for wire bonding. For example copper is a highly solderable material, but is a poor choice for wire bonding. The reason is that copper readily forms an oxide layer which exhibits poor bonding properties. While an ambient can be provided within which adequate bonding will take place, the cost of doing so is prohibitively expensive and so the process has never developed.

Similarly, materials which exhibit good wire bonding capability generally do not do well when soldered. For example, aluminum is a good material for bonding. However, the oxide layer which forms over aluminum must be removed in order to achieve a strong solder joint. Etchants for removing the oxide layer are extremely aggressive and tend to etch away portions of the underlying aluminum in addition to the oxide layer. While this overetch may be acceptable where bulk aluminum is used, it is a problem with thin film aluminum structures since there is very little aluminum to start with.

There is a need, therefore, for a redistribution metallization which can accommodate both solder bumping and wire bonding. It is desirable to have a process which integrates well with existing redistribution metallization methods and yet provide solder bumps and wire bond structures.

SUMMARY OF THE INVENTION

The redistribution metallization scheme of the present invention includes conventional solder bumps in addition to the presence of new wire bond pads which can serve to relocate the bond pads which exist on the semiconductor die. This improves the connectivity options for the device, especially in flip-chip applications.

Fabrication of the redistribution metallization in accordance with the invention includes depositing a passivation layer and forming openings to the underlying bond pads as needed. A trimetal layer is then blanket deposited atop the passivation layer and etched to form the necessary redistribution traces. At the same time additional wire bond pads are patterned as well. A second passivation is deposited and etched to expose areas atop the underlying metallization at location where solder bumps will be formed and at locations corresponding to the added wire bond pads. Next, solder bumps are formed. In one embodiment, a subsequent etch step is made to expose an underlying metal layer of the trimetal layer at the locations of the added wire bond pads.

BEST MODE FOR CARRYING OUT THE INVENTION

Figure 1:
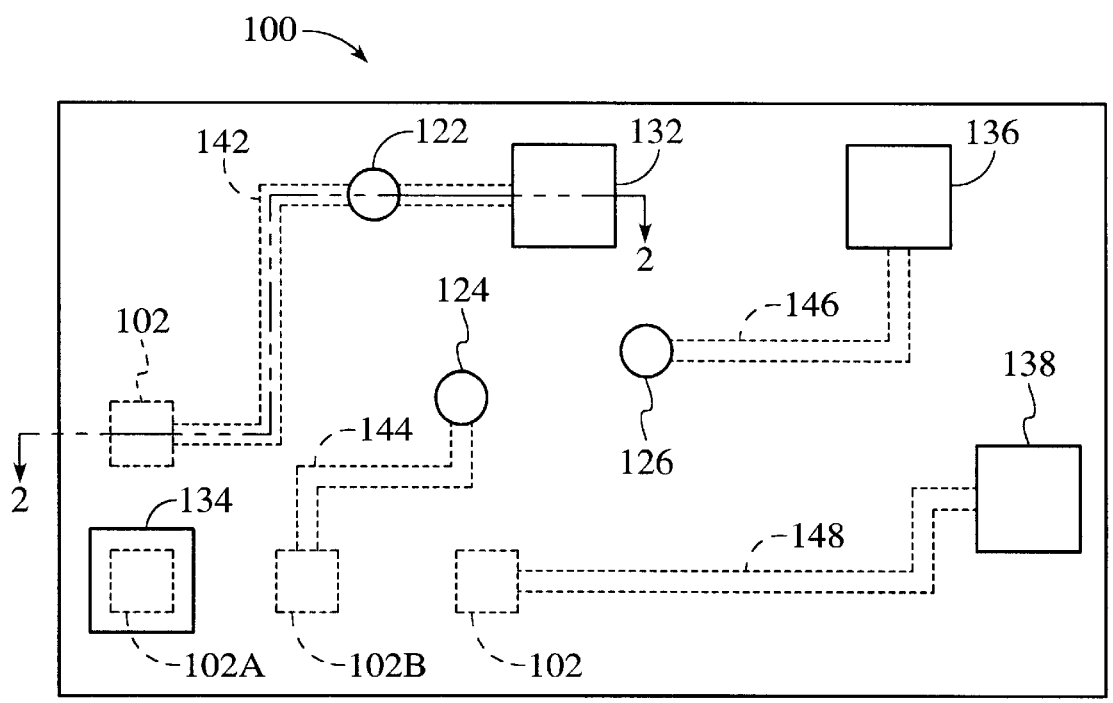
FIG. 1 is a top view of a typical IC device, showing the underlying wire bond pads and the metal redistribution layer.

Referring to FIG. 1, the present invention is directed to a scheme which comprises a redistribution metallization that combines solder bumps and wire bond pads at its redistribution layer. A semiconductor device 100 consists of an underlying substrate having a plurality of wire bond pads 102 formed thereon, shown in phantom lines. A metallization layer carries a plurality of traces 142–148 having first ends which are in electrical contact with the underlying wire bond pads 102. Disposed along these traces are solder bumps 122 and additional wire bond pads 132–138. The solder bumps and additional pads are effectively "redistributed" over the surface of the semiconductor device by way of the traces, thus providing higher pinout counts. Greater I/O pin packing density is achieved by arranging the solder bumps in the redistribution layer as an array of solder bump. The additional wire bond pads 132–138 permit wire bonding between the substrate and the IC package at positions other than the location of the original bond pads 102. This is especially advantageous in stacked chip configurations as will be discussed below.

Figure 2A:
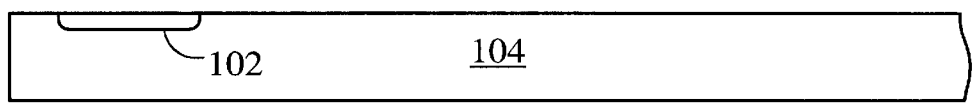
FIGS. 2A–2I show the process steps for producing the redistribution layer in accordance with the invention.

FIGS. 2A–2I show the processing steps of the present invention. These figures are taken from view line 2—2 of FIG. 1 and show how the redistribution metallization is formed. FIG. 2A starts off with an essentially finished semiconductor wafer 104. It is understood that the wafer comprises the necessary constituent substrate layer and its associated metal and insulative layers to fully define the circuitry for its intended functionality, including the wire bond I/O pads 102 needed for connection in an IC package.

Figure 2B:
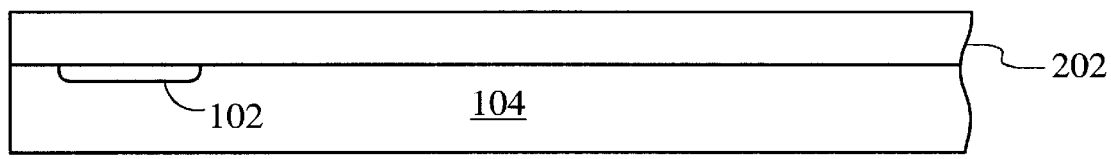
Figure 2C:
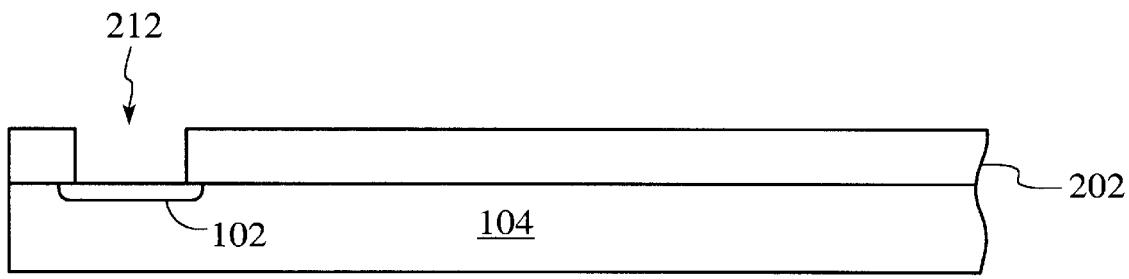
Figure 2D:
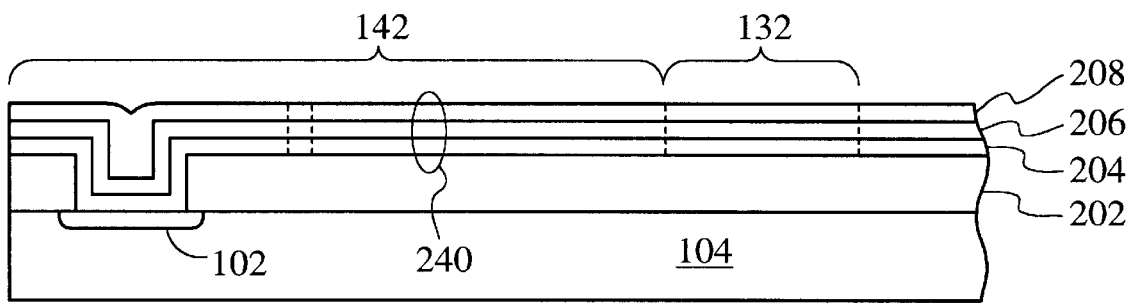

In FIG. 2B, a passivation layer 202 of a dielectric material is deposited over the upper surface of wafer 104. Any of a number of insulative materials can be used. For example, photo-definable benzocyclobutane (BCB) was used for layer 202.

Known photolithographic and etching techniques are used to drop a via 212 to the underlying wire bond pad 102, FIG.

2C. Next, a three layer metal structure 240 is blanket deposited over the etched passivation layer 202, FIG. 2D. Typically, this is achieved by a sputtering method, where each layer is sputtered on one at a time. First, a layer of aluminum 204 is sputtered. Then a nickel target is used to sputter deposit a layer of nickel 206 atop the aluminum layer. Finally, a copper target is provided to deposit a layer of copper 208 atop the nickel layer. The aluminum layer serves as an adhesive layer, while the nickel serves as a barrier layer between the copper and aluminum layers.

Figure 3A:
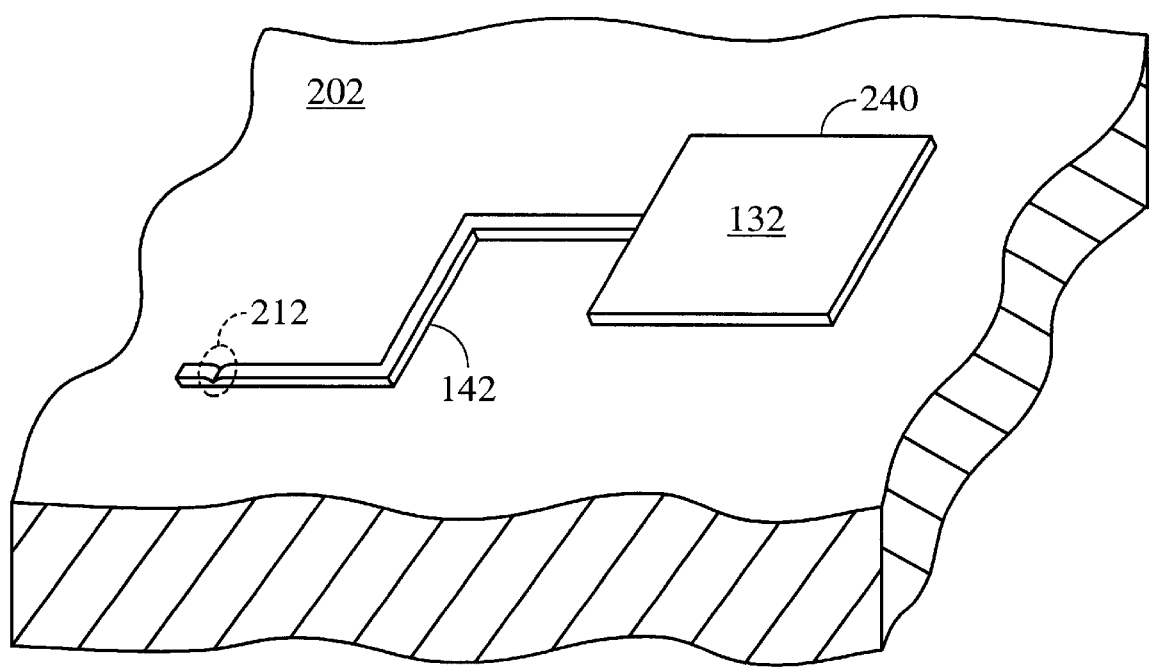
FIGS. 3A–3C show perspective views of intermediate results during processing in order to better understand those aspects of the invention.

The trimetal layer 240 is then photolithographically processed and etched to define the traces comprising the redistribution layer. Further, in accordance with the invention, the additional wire bond pads 132–138 are defined in the trimetal layer. The trace 142 and additional pad 132 are indicated by the dashed lines in FIG. 2D. The perspective view of FIG. 3A more clearly illustrates this aspect of the invention. The illustration in FIG. 3A shows the formation of trace 142 atop passivation layer 202, a first end of which is in electrical contact with underlying pad 102 through via 212. The other end of trace 142 terminates in a new wire bond pad 132, also formed atop the passivation layer.

Figure 2E:
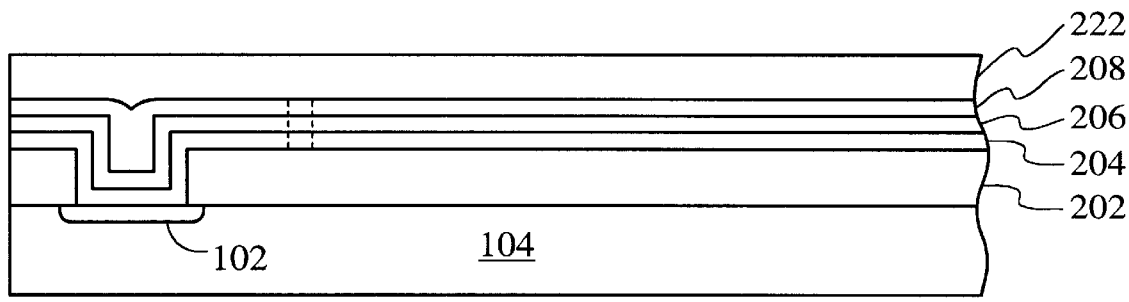
Figure 2F:
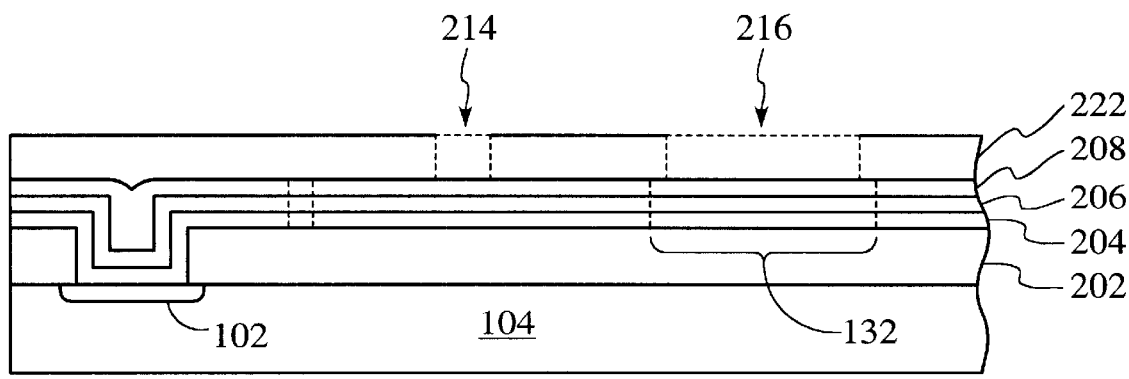
Figure 3B:
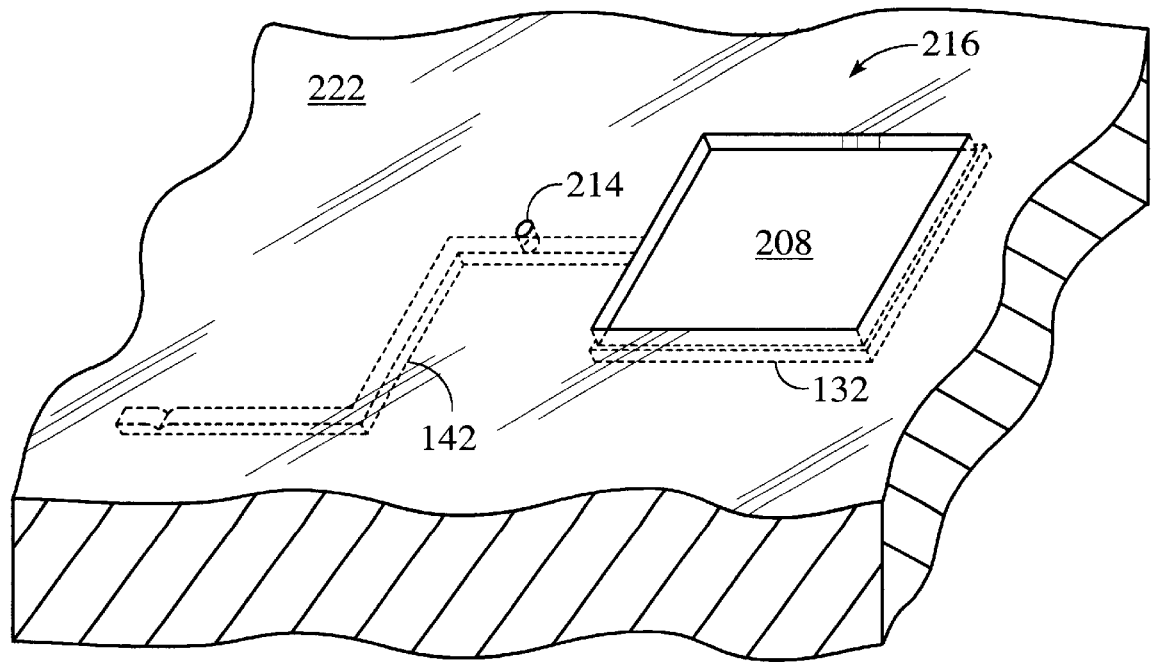
Figure 3C:
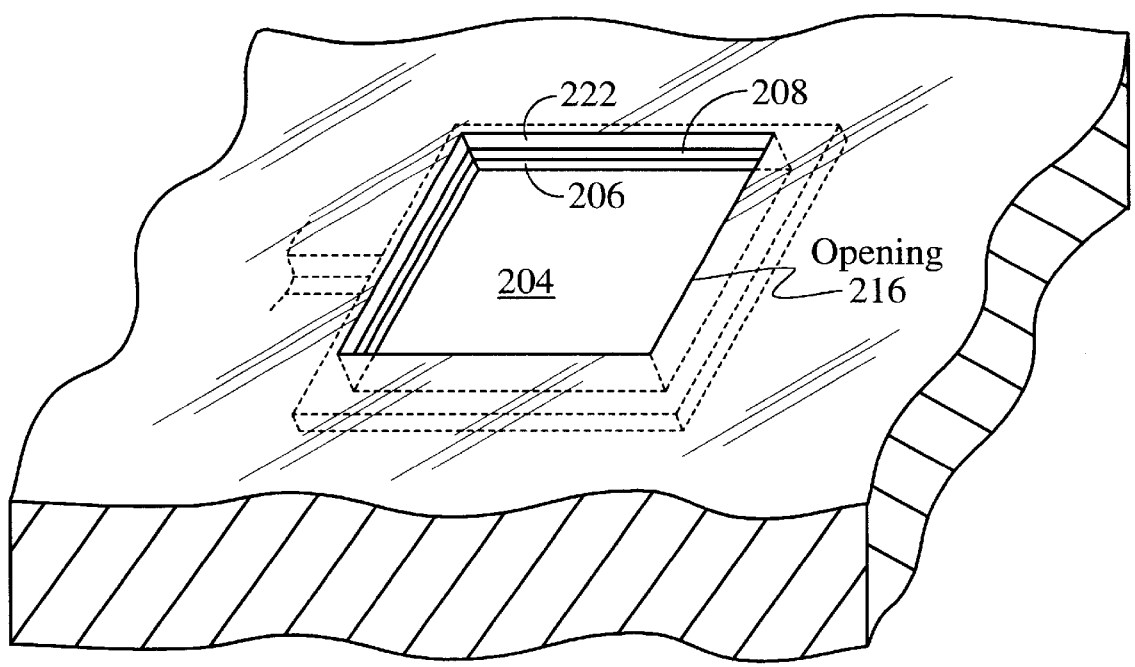

A second passivation layer 222 is then deposited atop the etched trimetal layer 240, FIG. 2E, to provide a protective seal against moisture and contaminants and to serves as a scratch protection layer. The second passivation layer 222 is then etched away to open up solder bump sites 214 through the passivation layer to the trimetal layer. In addition, pad openings 216 are made through the passivation layer to the trimetal. The pads openings are coincident with the wire bond pads 132 formed in the trimetal. The openings 214 and 216 made in this step, as illustrated in FIG. 2F, leave exposed the surface of the uppermost layer of the trimetal, namely the copper layer 208. The perspective view of FIG. 3B shows the wafer at this stage of processing more clearly. Here, the trace 142 and added wire bond pad 132 are shown in dashed lines indicating they lie beneath the insulation layer 222. Openings 21 and 216 are shown, exposing the underlying copper layer 208.

Figure 2G:
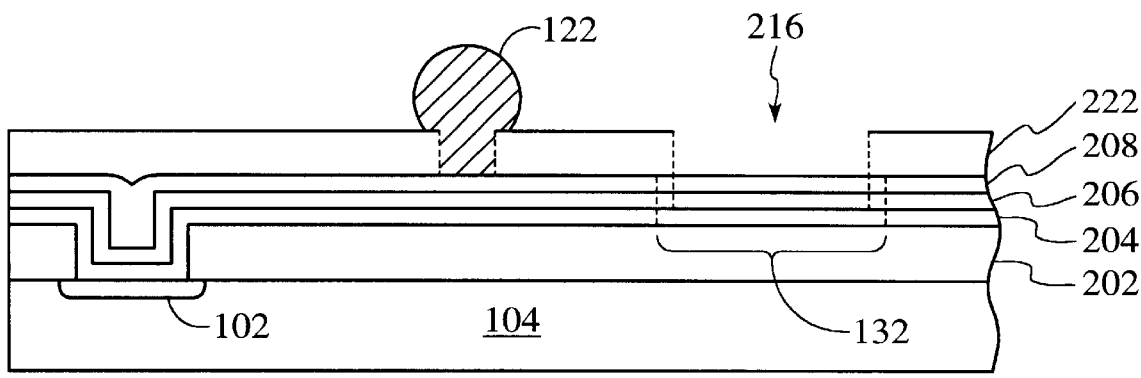

Referring next to FIG. 2G, the solder bump sites 214 are filled with solder and any appropriate barrier metals to form reliable solder bumps 122 using known C4 (controlled collapse chip construction) techniques or other ball-grid array processing techniques. Recall that copper is very well suited for solder bump formation and so the solder bumps 122 will have a strong mechanical coupling to the underlying redistribution metallization.

Figure 2H:
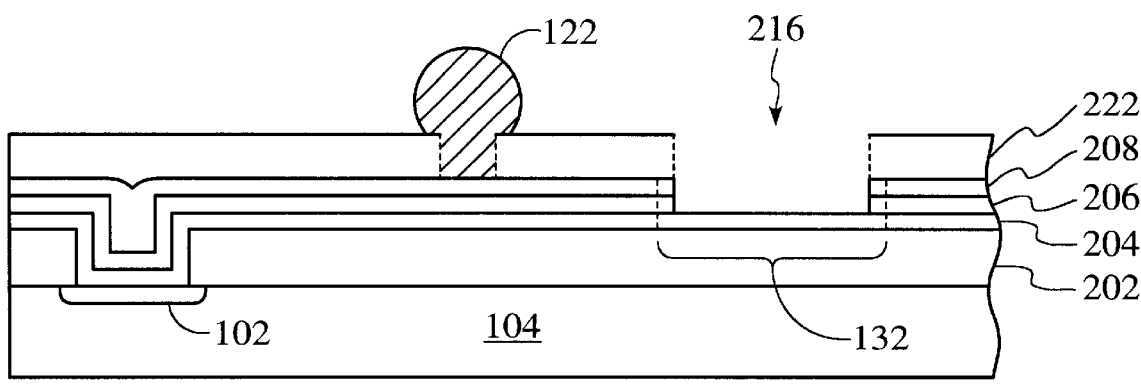
Figure 2I:
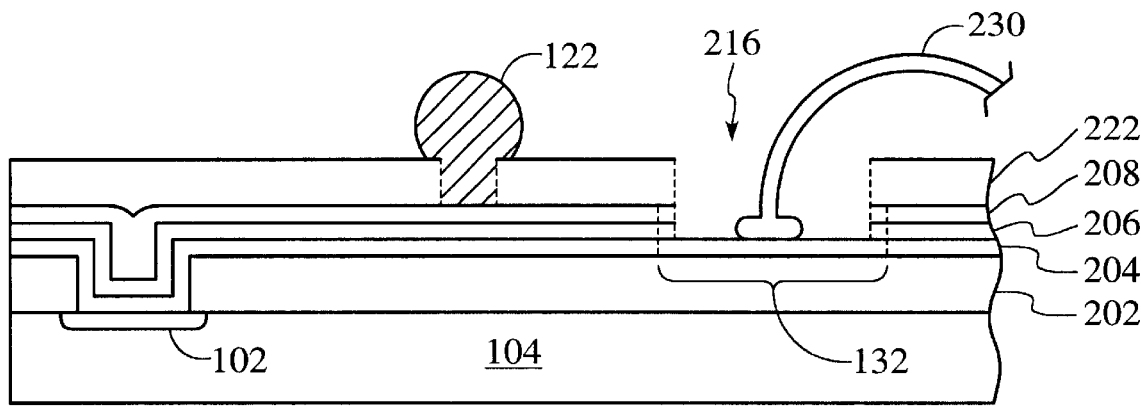

Recalling further that due to its high oxidation rate, copper is less than ideal for wire bonding applications, whereas aluminum is a bondable metal. Thus, in accordance with the invention, the solder bumped wafer is subjected to a subsequent etch step to remove the copper layer and nickel layer that is exposed through the openings 216. This can be accomplished by any of a number of known wet-chemical etch techniques for removing aluminum and nickel. The result of the etch step is shown in FIG. 2H where wire bond pad 132 now consists of a single layer of aluminum. It is to the surface of the aluminum layer that wires (e.g. wire 230, FIG. 2I) will be bonded in a subsequent wire bonding operation.

The foregoing preferred embodiment discusses the use of a copper/nickel/aluminum trimetal layer. Metals other than aluminum can be used as the bondable layer, including palladium and platinum. Moreover, it is possible to attain the solder bump & wire pad arrangement of the present invention if the uppermost layer of metal is gold. Thus, in an alternative embodiment of the invention gold is used. With respect to FIG. 2D then, a bottom-most conductive metal adhesion layer 204 can be sputtered onto passivation layer 2102. Typical adhesion metals include aluminum and titanium-tungsten (TiW). As before, the metal layer is etched to form the desired traces 142–148 comprising the redistribution layer and the added wire bond pads 132–138.

Next, a layer of nickel 206 is deposited followed by a layer of gold 208. As shown in FIGS. 2E and 2F, the second passivation layer 222 is then deposited and etched to form openings 214 and 216. Finally, solder bump 122 is formed, FIG. 2G. The subsequent metal etch step shown in FIG. 2H is not needed. The reason is that gold exhibits adequate bonding properties for wire bonding purposes. The upper layer of gold is therefore retained. However, it is noted that gold does not solder well, since gold leaches into the solder during the soldering operation. However, in this embodiment of the invention where the trimetal layer is gold/nickel/adhesion (AL or TiW), as the gold leaches into the solder during the soldering operation, the solder will encounter the nickel layer. Since nickel is a solderable metal, the solder bump will be reliably affixed to its solder bump pad area. Thus, the use of a gold/nickel layer presents both a bondable and a solderable layer.

Referring back to FIG. 1, various uses of the added wire bond pads are possible. An added wire bond pad can simply be placed atop its corresponding underlying wire bond pad. Thus, bond pad 134 is located atop bond pad 102A. This configuration is used when the underlying pad 102A does not need to be relocated. Another use arises in flip-chip configurations. A connection from the upper chip can be made to a bond pad on the lower chip to bring out the signal to an external pin. Thus, solder bump 126 would be coupled to a coincident conductive via on an upper chip providing a connection to pad 136 on the bottom chip by way of trace 146. Yet another use might arise in highly complex applications where the circuit density is high. One can imagine a situation where it is desirous to route underlying bond pad 102B to a new location such as pad 136. However, such a direct routing may not exist due to the density of the circuitry. The present invention, however, provides an arrangement whereby pad 102B is routed to an upper chip in flip-chip design via trace 144 and solder bump 124. The upper chip carries the signal to solder bump 126 which then continues on to pad 136 via trace 146. It can be seen from these examples that numerous applications of the redistribution layer are contemplated, limited only by the artisan's imagination. The invention lies not with the particular patterns possible in the redistribution metallization, but rather in the fact that solder bumps and wire bond pads can be combined to provide additional flexibility in terms of connectivity within a semiconductor device and between two flip-chip connected die, and in the way the redistribution metallization is formed to allow both solder bumps and wire bond pads in the first place.

What is claimed is:

1. In a semiconductor device having a first plurality of wire bond pads disposed on a first surface thereof, a method for creating solder bump pads and a second plurality of wire bondable pads comprising the steps of:

depositing an insulation layer atop the first surface;

forming vias through the insulation layer to the first wire bond pads;

depositing a trilaminate metal layer over the insulation layer, including depositing an aluminum layer over the insulation layer, depositing a nickel layer atop the aluminum layer, and depositing a copper layer atop the nickel layer thereby providing an electrical path through the vias to the first wire bond pads;

patterning the metal layer to form redistribution traces and the second wire bond pads, at least some of the redistribution traces having electrical paths by way of the vias to the first wire bond pads;

depositing a blanket coat of a dielectric material atop the metal layer;

forming first and second openings through the overcoat to the metal layer, the first openings coinciding with the redistribution traces, the second openings coinciding with the second wire bond pads;

forming solder bumps onto the redistribution traces through the first openings; and removing the copper layer and the nickel layer from portions of the trilaminate metal layer exposed through the second openings.

2. In a semiconductor dice having a first plurality of wire bond pads disposed on a first surface thereof, a method for creating solder bump pads and a second plurality of wire bondable pads comprising the steps of:

depositing an insulation layer atop the first surface;

forming vias through the insulation layer to the first wire bond pads;

depositing a trilaminate metal layer over the insulation layer, including depositing either a palladium or a platinum layer over the insulation layer, depositing a nickel layer atop the palladium or platinum layer, and depositing a copper layer atop the nickel layer thereby providing an electrical path through the vias to the first wire bond pads;

patterning the metal layer to form redistribution traces and the second wire bond pads, at least some of the redistribution traces having electrical paths by way of the vias to the first wire bond pads;

depositing a blanket coat of a dielectric material atop the metal layer;

forming first and second openings through the overcoat to the metal layer, the first openings coinciding with the redistribution traces, the second openings coinciding with the second wire bond pads;

forming solder bumps onto the redistribution traces through the first openings; and removing the copper layer and the nickel layer from portions of the trilaminate metal layer exposed through the second openings.

3. A method of packaging a semiconductor device comprising the steps of:

fabricating a semiconductor die having a plurality of circuitry and further having an upper surface and a first plurality of wire bond pads formed on the first surface;

depositing an insulation layer atop the upper surface;

opening vias through the insulation layer to the first wire bond pads;

blanket depositing a metal layer atop the insulation layer including first sputtering a bottom metal layer of aluminum, palladium or platinum atop the insulation layer, sputtering a nickel layer atop the bottom metal layer, and sputtering a copper layer atop the nickel layer;

patterning the metal layer to form redistribution traces, a first plurality of said redistribution traces having second wire bond pads formed therewith, a second plurality of said redistribution traces having being in electrical contact with said first wire bond pads;

depositing an overcoat of a dielectric material atop the metal layer and forming first and second openings through the overcoat to the metal layer, the first openings coincident with the redistribution traces, the second openings coincident with the second wire bond pads;

forming solder bumps through the first openings;

removing the copper and nickel layers from the metal layer exposed through the second openings; and bonding wires to the bottom metal layer exposed through the second openings;

whereby the wires are connected to a lead frame of an IC package.

4. In a semiconductor dice having a first plurality of wire bond pads disposed on a first surface thereof, a method for creating solder bump pads and a second plurality of wire bondable pads comprising the steps of:

depositing an insulation layer atop the first surface;

forming vias through the insulation layer to the first wire bond pads;

depositing a blanket coat of a metal layer over the insulation layer thereby providing an electrical path through the vias to the first wire bond pads;

patterning the metal layer to form redistribution traces and the second wire bond pads, at least some of the redistribution traces having electrical paths by way of the vias to the first wire bond pads;

depositing a blanket coat of a dielectric material atop the metal layer;

forming first and second openings through the overcoat to the metal layer, the first openings coinciding with the redistribution traces, the second openings coinciding with the second wire bond pads; and forming solder bumps onto the redistribution traces through the first openings;

etching at least the topmost layer of portions of the metal layer that are exposed through the second openings.

5. The method of claim 4 wherein the metal layer is a trilaminate metal layer; wherein the step of depositing the metal layer includes depositing an aluminum layer over the insulation layer, depositing a nickel layer atop the aluminum layer, and depositing a copper layer atop the nickel layer; and further including removing the copper layer and the nickel layer from portions of the trilaminate metal layer exposed through the second openings.

6. The method of claim 4 wherein the metal layer is a trilaminate metal layer; wherein the step of depositing the metal layer includes depositing either a palladium or a platinum layer over the insulation layer, depositing a nickel layer atop the aluminum layer, and depositing a copper layer atop the nickel layer; and further including removing the copper layer and the nickel layer from portions of the trilaminate metal layer exposed through the second openings.

7. The method of claim 4 wherein the step of depositing the metal layer is a step of depositing an adhesion metal layer over the insulation layer, depositing a nickel layer atop the adhesion metal layer, and depositing a gold layer atop the nickel layer.

8. The method of claim 7 wherein the adhesion layer is selected from the group comprising: aluminum, titanium and titanium-tungsten.

9. A method of packaging a semiconductor device comprising the steps of:

fabricating an integrated circuit semiconductor die having an upper surface and a plurality of first wire bond pads formed on a peripheral region of the first surface;

depositing an insulation layer atop the upper surface;

opening vias through the insulation layer to the first wire bond pads;

blanket depositing a metal layer atop the insulation layer;

patterning the metal layer to form redistribution traces, a first plurality of said redistribution traces having second wire bond pads formed therewith, a second plurality of said redistribution traces being in electrical contact with said first wire bond pads;

depositing an overcoat of a dielectric material atop the metal layer and forming first and second openings through the overcoat to the metal layer the first openings coincident with the redistribution traces, the second openings coincident with the second wire bond pads;

forming solder bumps onto the redistribution traces through the first openings;

etching at least the topmost layer of portions of the metal layer that are exposed through the second openings;

bonding wires to the metal layer exposed through the second openings; and whereby the wires are connected to a lead frame of an IC package.

10. The method of claim 9 wherein the step of blanket depositing a metal layer includes first sputtering a bottom adhesive metal layer atop the insulation layer, sputtering a nickel layer atop the bottom metal layer, and sputtering a copper layer atop the nickel layer.

11. The method of claim 10 wherein the adhesive metal is one of aluminum, titanium and a titanium tungsten alloy.

* * * * *